United States Patent
Ben Chouikha et al.

[11] Patent Number: 5,883,421
[45] Date of Patent: Mar. 16, 1999

[54] PHOTODETECTOR BASED ON BURIED JUNCTIONS AND A CORRESPONDING METHOD OF MANUFACTURE

[75] Inventors: Mohamed Ben Chouikha, Auberbilliers; Guo Neng Lu, Grigny; Mohamed Sejil, Paris; Gérard Sou, Ivry-sur-Seine, all of France

[73] Assignee: University Pierre et Marie Curie, Paris Cedex, France

[21] Appl. No.: 816,328

[22] Filed: Mar. 13, 1997

[51] Int. Cl.[6] ..................................................... H01L 31/06
[52] U.S. Cl. .......................... 257/461; 257/464; 257/435
[58] Field of Search .................................. 257/440, 461, 257/464, 435

[56] References Cited

U.S. PATENT DOCUMENTS

4,318,115  3/1982  Yoshikawa et al. ..................... 257/464

*Primary Examiner*—Minh Loan Tran
*Attorney, Agent, or Firm*—Young & Thompson

[57] ABSTRACT

A photodetector based on buried junctions includes a semiconductor structure with two successive p-n junctions, buried at increasing depths, assembled in pairs in opposition, and defining at least three layers. One of the layers is adjacent to a photosensitive portion of the surface of the photodetector. A reverse bias is applied to the junctions, and the values of at least two internal currents passing through such junctions is detected. The internal currents are generated by received light, with each of the junctions corresponding to a particular wavelength of the received light.

18 Claims, 4 Drawing Sheets

PHOTODETECTOR BASED ON BURIED JUNCTIONS AND A CORRESPONDING METHOD OF MANUFACTURE

BACKGROUND OF THE INVENTION

1. Field of the invention

This invention relates to optical detection and relates to a photodetector based on buried junctions and its method of manufacture, an optical sensor, systems for color imaging, artificial vision, color measurement and spectral measurement and a method of spectral measurement.

It has applications particularly in the field of color imaging, for video cameras producing color images. These cameras can be intended for the public at large, such as video cameras or visual conference cameras or for professional use, such as, for example, those used for audio-visual production or for medical imaging.

The invention also has applications in the field of artificial vision, notably for artificial retinas for the detection of colors.

A third field of application of the invention is concerned with the measurement of colors, for systems such as, for example, scanners or devices for matching colors for color printing.

The fourth field of application, spectral measurement, relates to the measurement of the absorption, emission or reflection spectrum of a solution, a solid or a colored gas or of a smoke, as well as the measurement of the spectral composition of light which is a determinant for the measurement of properties of a physical, chemical or biological phenomenon. Hence this field of application covers colorimetry which consists of determining the principal or dominant wavelength of light from an object or a colored substance in such a way as to obtain its summary color. Colorimetry can be notably used in the chemical field (measurement of absorbance, pH measurement of a substance, or the indirect measurement through injection of a coloring agent), in the biomedical field (biological or biochemical) and in the environmental field (gas measurement, pollution detection, measurement of concentration of elements in a solution). This field of application also covers spectrocolorimetry consisting of determining a color spectrum by spectral dispersion.

By "photodetector" one understands a device that responds to the presence of optical radiation producing an electromotive force or a variation in electrical resistance which is independent of the spatial distribution of the optical radiation. By "optical sensor" one understands, more generally an input device for a measurement, detection, analysis, recording, reproduction or transmission chain, that is sensitive to optical radiation due to the use of a photoelectric effect. An optical sensor can therefore include a plurality of photodetectors.

2. Description of the Prior Art

It is known to use optical luminous intensity detectors, such as photodiodes and phototransistors. These components give an electrical signal which is a function of the intensity of incident light, but do not supply any information concerning the spectral composition of this light.

So as to detect three chromatic components corresponding to the color of an object or of light, a system with three CCD sensors has been suggested. The three sensors are each fitted with an optical filter arranged in front of the sensor assembly. The three filters are generally associated with the three complementary colors, blue, green and red.

This system however has the disadvantage of requiring expensive, specific and precise optics.

Furthermore, since each sensor includes an array of photodetectors, three photodetectors belonging respectively to the three sensors are set to work for each pixel of a color image. This optical acquisition system therefore occupies a photodetector surface area three times that of an acquisition system without color whilst at the same time the precision of the measurements of the distance between pixels is reduced.

An optical acquisition system for color images is also known that includes a single CCD sensor. The sensor comprises a plurality of photodetectors, on which optical filters are directly deposited. Generally, blue, green and red optical filters are alternated in an array of photodetectors.

A disadvantage of this optical system is that it necessitates recourse to specific technology for the deposition of the optical filters. Furthermore, this second system has the same disadvantages as the first in relation to the surface area necessary for each pixel and the precision of the measurements of distance between pixels. Finally the array of photodetectors has a paving that lacks geometrical symmetry.

In relation to spectral measurement, a dispersive unit or a set of optical filters, arranged in front of a single detector or a linear detector array is generally used.

The system with a single detector has the disadvantages of requiring mechanical displacement means, difficult to produce or expensive and not allowing measurements to be made in real time.

As for the system with a linear array of detectors, it has the disadvantage of providing a measurement accuracy that depends on the precision of the positioning of the linear array and of the calibration of the system.

Furthermore, the two systems have the common disadvantages of producing spectral measurements which are greatly dependent on the dispersive unit, and very sensitive to the operating conditions of the apparatus, notably through fluctuations of the spectrum and of the intensity of the light source.

A method and a system for determining the wavelength of light incident on a photosensitive semiconductor structure has been proposed in the patent U.S. Pat. No. 4,749,851.

A disadvantage of the system disclosed is that the measured wavelength is prone to variations in relation to measurement voltages. Furthermore, this system makes it necessary to develop a structure with a high doping level.

3. SUMMARY OF THE INVENTION

This invention is directed to a color photodetector, and more generally a photodetector that allows one to obtain information on the intensity of the incident light and on its spectral composition at the same time.

The aim of the invention is such a detector that requires neither deposition of an optical filter nor specific optics.

The invention aims at a photodetector that allows one to obtain reliable and reproducible components and to integrate onto the same chip, the photodetector and the electronics for processing the signal and indeed for processing the information.

The invention also aims at a photodetector capable of giving a measurement of the wavelength and advantageously of the flux of monochromatic or quasi-chromatic light without recourse to specific optics.

The aim of the invention is such a photodetector able to give accurate measurements, not affected by the experimental conditions and not requiring specific calibration.

An objective of the invention is also an optical sensor including a plurality of photodetectors and allowing the acquisition of a color image, or, more generally, the obtaining of information on the spectral composition of an image, this sensor necessitating neither deposition of any optical filter nor specific optics.

The invention aims at such a sensor having a reduced detection surface area, of the same order as that required in the absence of any color detection or spectral information.

The invention aims at such a detector that allows symmetry of the photodetector pavement and precision in the measurement of distances between pixels.

This invention also has the aim of systems for color imaging, artificial vision and color measurement that have the advantages previously mentioned for the sensor.

A supplementary aim of the invention is a system of spectral measurement that has the advantages previously mentioned for the photodetector.

Another objective of the invention is a method of manufacture of a photodetector that has the advantages mentioned above.

An aim of the invention is also a method of spectral measurement that allows information to be obtained about the spectral composition of a monochromatic or quasi-chromatic light, or about the variations in spectral composition of a polychromatic light without optical filtering or specific optics.

To this end, the subject of the invention is a photodetector including a structure based on buried junctions comprising;

a semi-conductor structure having a surface, and including at least two successive p-n junctions buried at increasing depths, assembled in pairs in opposition and defining at least three layers, one of these layers being adjacent to a photosensitive part of the surface, means of applying reverse bias to the junctions, and means of detecting the intensities of at least two internal currents passing respectively through said junctions, these internal currents being generated by the reception of light on the photosensitive part, each of the junctions being associated respectively with one peak wavelength of the light, the intensity of the internal current passing through this junction having a peak centered on said peak wavelength for a constant luminous power.

According to the invention, the structure is produced on a chip by conventional integrated circuit technology.

The structure of the photodetector according to the invention is thus based on reverse biased buried junctions.

The surface referred to in the definition of the photodetector is the surface receiving the light, considered to be the upper surface of the structure. Hence, the depth is measured with reference to this upper surface.

The idea of "intensity peak" must be understood in the sense of the curve of spectral intensity variations, once smoothed, having a roughly convex shape, having a maximum in the intensity peak, at least within a given range of wavelengths.

The values of the peak wavelengths depend notably on the geometry of the structure, the biasing of the junctions and the temperature of the photodetector as well as the intensity of the light. Therefore they depend particularly on the depths of the junctions. In order to give peak wavelengths of the desired values, the properties and the appropriate ways of using the photodetector are determined.

Preferably, the conditions of use and the values for all of the parameters with the exception of the depths of the junctions are determined, and these depths are determined in order to obtain the desired peak wavelengths. In effect, each of the peak wavelengths increases with the depth of the associated junction. This behavior can be schematically explained by the following physical phenomenon. The semiconductor, which is made of silicon, has an absorption coefficient that is strongly dependent on the wavelength. This coefficient decreases rapidly when the wavelength of the light is increased provided that the photogenerated charge carriers are distributed within a region at little depth for short wavelengths and spread in depth for the large wavelengths.

The peak wavelengths are preferably between 0.3 $\mu$m and 1 $\mu$m. Advantageously they are distributed within the visible range.

The photodetector according to the invention produces several electric currents, each of them corresponding to a favored spectral range. A single photodetector thus fulfills the same function as a plurality of photodetectors in traditional sensors. The photodetector according to the invention hence requires neither deposition of an optical filter nor specific optics. It allows a reduction in the surface necessary for a sensor including such detectors and makes it possible for the pavement of this sensor to have symmetry and, in the case where the peak wavelengths correspond to the three colors blue, green and red, it gives precision to the measurement of distances between pixels of a color image.

By "integrated circuit technology", a method of manufacturing integrated electronic circuits in proximity to the surface of a semiconductor wafer, preferably made of silicon, is understood.

The term "conventional" applied to such a technique refers to CMOS, BiCMOS and bipolar technologies mentioned below.

Conventional CMOS technology includes the layout, on the same substrate of NMOS type transistors and PMOS type transistors. In order to do this, on a substrate with the first type of conductivity (for example P) at least one well with the second type of conductivity (N in the example) is created and at least one diffusion layer of the first type of conductivity (P+ in the example) is formed in the surface of the well. The diffusion layer has a thickness of the order of a few tenths of a micron and the well has a depth of the order of one to a few microns. On the surface of the structure obtained, a deposition of a layer of polysilicon and of at least two metal layers, separated by insulating layers, for example $SiO_2$ is carried out. The layer of polysilicon is notably used to form the gate of the transistors. Metal layers are advantageously used as an opaque mask, in order to avoid photogeneration of electron holes in the peripheral region of the structure.

A conventional BiCMOS technology includes the layout on the same substrate of MOS field effect transistors and bipolar transistors. In order to do this, a vertical NPN or PNP transistor is laid out in a P or N substrate respectively. The transistor, for example NPN, including successively with increasing depth, an emitter (N++), a base (P+), a collector (N) and a collector plate (N+), the structure is developed by double diffusion: diffusion of the base in the collector, then of the emitter in the base. The junctions between the emitter and the base, between the base and the collector and between the collector plate and the substrate have respectively values of the order of a few tenths of a micron, a few tenths of a micron and a micron.

Conventional bipolar technology differs from conventional BiCMOS technology by the absence of MOS field effect transistors in the layout on a substrate of bipolar transistors.

The use of a conventional integrated circuit technology is extremely advantageous in terms of the ease of manufacture and of cost. In addition, reliable and reproducible components are thereby obtained. Another technical advantage from integration of the photodetector is the possibility of incorporating, on the same chip, a sensor, electronics for the processing of the signal and even electronics for the processing of the information. Hence a totally integrated microsystem can be manufactured.

For photodetectors according to the invention including two or three junctions, the peak wavelengths have values determined essentially by the diffusion and the well depths, the doping, diffusion and the well levels only having a small effect.

Preferably, the biasing means and the detection means are incorporated in the chip.

Thus, a system entirely integrated onto the same chip can be obtained, without addition of supplementary processing with conventional integrated circuit technology for the production of photodetectors.

In a first preferred embodiment of the photodetector according to the invention, the structure includes three p-n junctions. The structure of the photodetector is then preferably produced by BiCMOS or bipolar technology. It is advantageous that the three peak wavelengths are situated respectively within the wavelength ranges associated with the colors blue, green and red.

In a second preferred embodiment of the photodetector according to the invention, the structure includes two p-n junctions. The structure of the photodetector is then preferably produced by CMOS technology. It is however, equally possible to produce the structure through BiCMOS or bipolar technology. It is advantageous that the two peak wavelengths should be respectively situated in the wavelength ranges associated with the colors blue and red. In an advantageous form of creating this characteristic, the depths of the two junctions have values respectively between 0.3 $\mu$m and 0.5 $\mu$m and between 1.7 $\mu$m and 3.5 $\mu$m. In a general way, the depth of the deep junction is advantageously 3 to 10 times greater than the depth of the junction close to the surface.

A photodetector according to the invention with a double junction advantageously includes means of spectral measurement. The polychromatic light having an intensity centered on a centering wavelength, these means calculate a value of the ratio of the intensities of the two internal currents and extract the centering wavelength by means of a reference curve giving the spectral evolution of this ratio.

Such a photodetector gives a reliable result which does not require photometric standardization, since the ratio of the intensities does not vary with the intensity of the light.

If the light is quasi-monochromatic, or has a single narrow peak in the spectrum, the centering wavelength obtained corresponds to the dominant wavelength of the light. The photodetector thereby allows the determination of the tonality of a pure or very saturated color.

If, on the contrary, the light has any kind of spectrum, the ratio of the intensities brings into play the integral of the light spectrum. This ratio is then sensitive to a change in the spectrum. Then, the sensor for the detection, for example, of a variation in the absorption, fluorescence or Raman spectrum, can be used.

Advantageously, the layers coming out respectively at parts of the surface, the photodetector includes an external circuit for the passing of external currents between the layers, connected to the parts of the surface, the means for biasing the junctions being constituted by voltage generators arranged in the circuit and the means of detecting intensities being connected to this circuit, the external currents being made up of combinations of the internal currents.

An object of the invention is equally an optical sensor including a plurality of photodetectors according to the invention, these photodetectors being juxtaposed. The optical sensor according to the invention can notably include a linear array or an array of photodetectors according to the invention.

The invention also supports systems of color imaging, artificial vision, color measurement or spectral measurement making use of at least one photodetector according to the invention.

Another object of the invention is a method of manufacturing a photodetector according to the invention, by conventional integrated circuit technology.

An object of the invention is also a method of spectral measurement in which;

light having an intensity centered on a centering wavelength is sent onto a photosensitive part of a surface of a semi-conductor structure, this structure being produced by conventional integrated circuit technology and including two successive p-n junctions buried at increasing depths, assembled in pairs, in opposition and defining three layers, one of these layers being adjacent to the photosensitive part and each of the junctions having a reverse bias, internal currents respectively passing through the junctions and being generated by the sending of the light are measured, each of the internal currents having, for constant luminous power, an intensity peak centered on a wavelength of the light, called the peak wavelength, a value of the ratio of the intensities of the two internal currents is calculated, and the centering wavelength is extracted from a reference curve giving the spectral evolution of this ratio.

Advantageously, after having determined the centering wavelength:

the centering wavelength obtained is carried onto a supplementary reference curve giving the spectral evolution of the intensity of one of the two internal currents for a reference luminous flux, a reference intensity of the current is extracted from the supplementary reference curve, and the luminous flux of the light is calculated by multiplying the reference luminous flux, by the ratio of the reference intensity of the current to the measured intensity of the current.

This method of spectral measurement is equally applicable to a photodetector with three p-n junctions or more, two of the measured internal intensities for example being used, to put the method into practice.

The invention is applicable to the fields of color imaging, artificial vision and the measurement of color, making use of at least one photodetector according to the invention or the method of photodetection according to the invention.

4. A BRIEF DESCRIPTION OF THE FIGURES

The invention will be better understood from the following description of certain embodiments and ways of using the invention, given as examples and referring to the appended drawings.

5. DETAILED DESCRIPTION OF PREFERRED EMBODIMENTS

Figure 1:
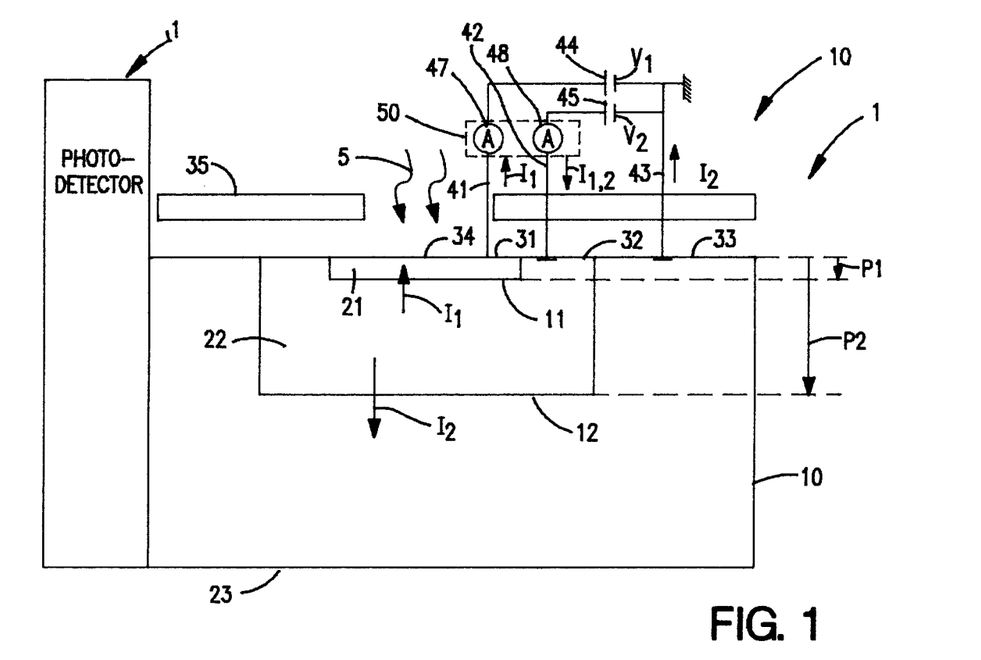
FIG. 1 is a section diagram of a first embodiment of a photodetect according to the invention.

In a first embodiment of a photodetector according to the invention, reference number 1, this includes a structure 10 based on silicon. This structure 10 includes two successive p–n junctions 11 and 12 buried at increasing depths, respectively marked P1 and P2. The two junctions 11 and 12 are assembled in opposition and define three layers 21, 22 and 23. The structure having a surface 30, the first layer 21 is bounded by the first junction 11 and the surface 30, the second layer 22 is between the second junction 12 on one hand and the first junction 11 and the surface 30 on the other hand, and the third layer 23 extends beyond the second junction 12.

In the example presented, the double p-n junction structure is of the PNP type. Hence, the first layer 21 is a P+ diffusion layer, the second layer 22 is an N type well and the third layer 23 is a P type substrate.

The structure 10 has an upper surface 30, onto which the first layer 21 comes out at a first central part 31, the second layer 22 at a second part 32 adjacent to the first part 31, and the third layer 23 at a third part 33 adjacent to the second part 32. The structure 10 is partially covered on its surface 30 by an opaque metal layer 35. This metal layer 35 covers the second and third parts 32 and 33 of the surface 30 as well as a peripheral portion of the first part 31. In this way, only a photosensitive part 34 of the first part 31 is exposed to the light, which prevents parasitic photocurrent contributions.

Advantageously, the depth P1 of the first junction 11 is between 0.3 $\mu$m and 0.5 $\mu$m and the depth P2 of the second junction 12 is between 1.7 $\mu$m and 3.5 $\mu$m.

The photodetector 1 also comprises an external electrical circuit 40. This circuit 40 includes three branches 41–43 respectively connected to the three parts 31–33 of the surface 30 and connected to one another. The circuit 40 thereby provides for the passing of external currents between the thee layers 21–23. The two first branches 41 and 42 are respectively fitted with voltage generators 44 and 45 and the third branch 43 is connected to the earth 46. The voltage generators 44 and 45 respectively apply positive voltages V1 and V2 to the layers 21 and 22 where:

0<V1<V2

Thus the two junctions 11 and 12 are reverse biased. By way of example, the voltages V1 and V2 are between 1 V and 5 V.

The external circuit 40 is also fitted with a device 50 for measuring external currents passing through the branches 41–43. In a simplified way, the measuring device 50 can be represented by two ammeters 47 and 48 respectively arranged in the branches 41 and 42.

The external circuit 40 thus fulfills a triple function: allowing the external passing of currents between the layers 21–23, biasing the junctions 11 and 12 and measuring the external currents.

Preferably, the measuring device 50 is an electronic device, advantageously integrated onto a chip. In a particular embodiment of such a measuring device 50, shown in FIG. 2, the device 50 includes a first part 50A incorporated into the external circuit 40 and a second part 50B outside the external circuit 40. In an electronic diagram the structure is shown by two photodiodes 61 and 62 in opposition, respectively linked to the two junctions 11 and 12. The first diode 61 has two terminals 65 and 66 respectively connected to the branches 41 and 42, whilst the second diode 62 has terminal 56 in common with the first diode 61 and a second terminal 67 connected to earth 46. The first part 50A consists of two resistances R1 and R2 respectively arranged in the branches 41 and 42.

Figure 2:
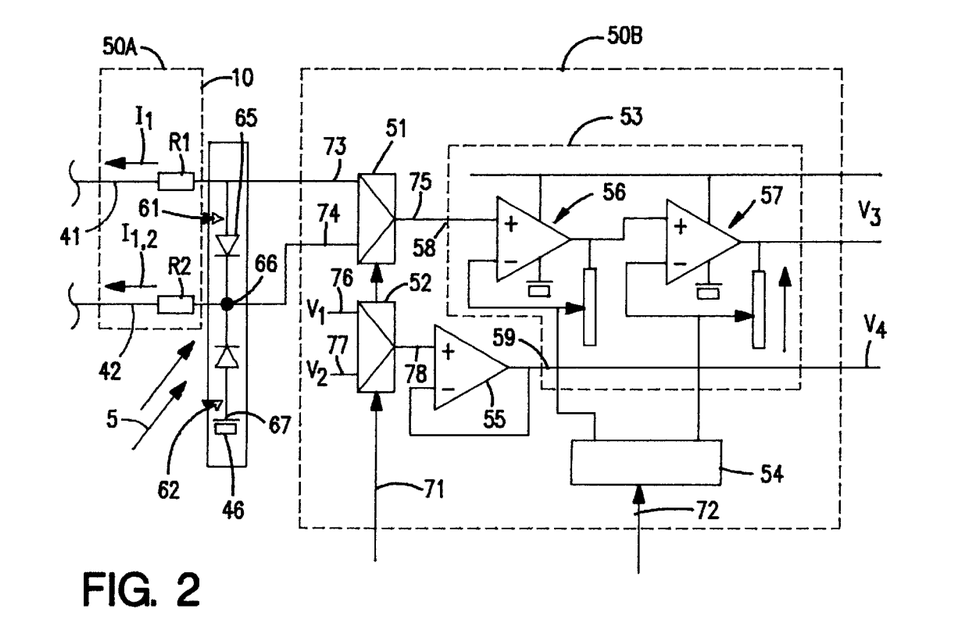
FIG. 2 is a block diagram representing an electronic assembly of the photodetector of FIG. 1.

The second part 50B of the measurement device 50 has the function of measuring the voltages at the terminals 65 and 66. These voltages give the currents passing through the branches 41 and 42, since they are equal to the voltages applied by the voltage generators 44 and 45 reduced by the voltage drops at the terminals of resistances R1 and R2. The second part 50B includes a first 2×1 multiplexer having its two inputs 73, 74 connected respectively to the terminals 65 and 66, which allows the selection of one or other of these terminals 65, 66. The part SOB also includes a second 2×1 multiplexer, reference number 52, having its two inputs 76, 77 powered respectively by reference voltages equal to V1 and V2, and being able to select one or the other at its output. The multiplexer 52 has a virtual earth select 71. The second part 50B also includes a non inverting amplifier 53 with two amplification stages 56 and 57, each stage 56, 57 having a programmable gain that can be varied from 1 to 100. The amplifier 53 is connected to a gain control unit 54, itself powered by a gain select 72. The amplifier 53 receives energy in the form of an amplification voltage V3. The amplifier having a signal input 58 and a floating earth input 59, the output 75 from the first multiplexer 51 is directly connected to the signal input 58 and the output 78 from the second multiplexer 52 is connected to the floating earth input 59. A buffer amplifier 55 with unity gain is placed between the second multiplexer 52 and the input 59. Thus a voltage drop is avoided, which would be due to the passage of a biasing current from the amplifier 53 through the turn-on resistance of the second multiplexer 52. The amplifier 53 produces an output voltage V4, representative of the current passing in the selected branch 41, 42.

Preferably, the structure 10, the external circuit 40 and the measuring device 50 are integrated onto an electronic chip. For the structure 10, conventional CMOS technology is advantageously used. It allows the layout of a detection cell incorporating the structure. It is then interesting to exploit the detection cell as a building block.

By way of an example, a chip is produced by conventional CMOS technology with an N-type well. This chip includes a 3×3 array of detection cells and on-chip circuitry. Each of the cells corresponds to the structure 10, its surface 30 measuring 200×200 $\mu m^2$ and having a central exposure window corresponding to the photosensitive part 34 which covers 180×180 $\mu m^2$. The on-chip circuitry itself includes the external circuit 40 and the measuring device 50.

Preferably, means for the control of temperature are used.

In operation, a carrier light 5 for an optical signal to be detected is sent onto the photosensitive part 34, the operating parameters such as the voltages V1, V2 being fixed. This light 5 has the effect of producing two photocurrents $I_1$, $I_2$ called internal currents, passing respectively through the junctions 11 and 12. The first internal current $I_1$ makes its way from the second layer 22 to the first layer 21 and the second internal current 12 makes its way from the second layer 22 to the third layer 23. This direction of the currents $I_1$ and $I_2$ results from the directions of the bias applied by the voltage generators 44 and 45.

The internal currents $I_1$ and $I_2$ reach the surface 30 of the structure 10 and pass in the form of external currents through the external circuit 40. Hence the currents $I_1$ and $I_2$ travel respectively through branches 41 and 43 in order to recombine in the second branch 42 while making their way to the second part 32 of the surface 30. The external circuit 40 has currents passing through its branches 41 and 42 respectively marked $I_1$ in order to simplify matters and $I_{1,2}$.

The external currents $I_1$ and $I_{1,2}$ are then measured by means of the measuring device 50 and the internal currents $I_1$ and $I_2$ are extracted from them. Each of these two currents $I_1$ and $I_{1,2}$ is proportional to the intensity of the light 5 within a favored range of wavelengths.

Figure 3:
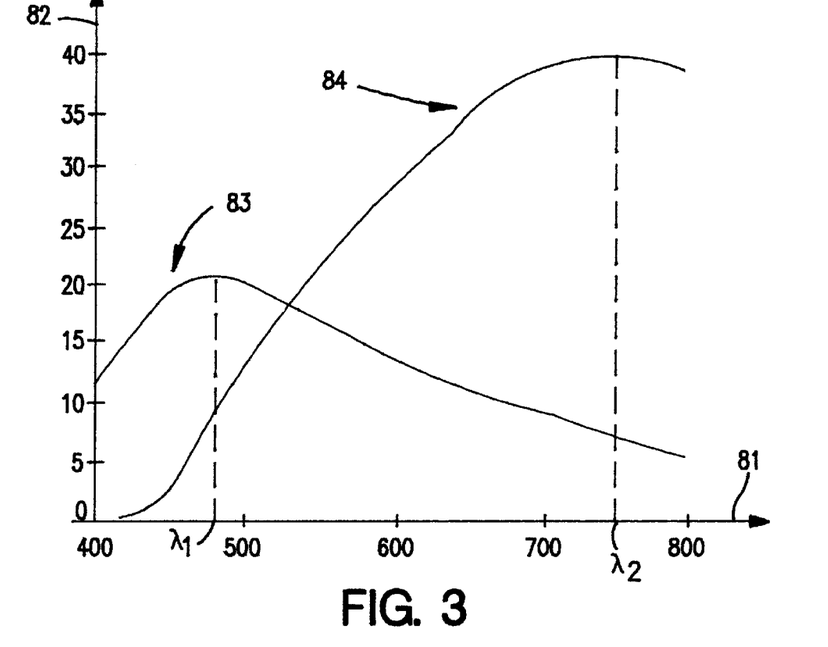
FIG. 3 show the spectral variations of the intensities of internal currents in the photodetector of FIGS. 1 and 2.

This favored spectral distribution for each of the two currents $I_1$ and $I_{1,2}$ will be illustrated in a particular example. In this example, the depths P1 and P2 have values respectively of 0.45 $\mu$m and 1.75 $\mu$m, and the voltages applied as reverse bias are respectively equal to 1.5 V and 3.5 V. Furthermore the configuration described above is used, including a 3×3 array of cells. The spectral distribution of the internal currents $I_1$ and $I_{1,2}$ is brought to the fore by using a monochromatic light source with a variable wavelength, in the form of a monochromator with a lamp. The monochromatic light is directed onto the photosensitive area of the chip through an optical fiber 1 mm in diameter having one end fixed in a hole on the top surface of a casing protecting the chip. The wavelength of the light 5 is varied within a wavelength range of between 400 nm and 800 nm while determining the internal currents $I_1$ and $I_2$ for a sample range of wavelengths. Two curves 83 and 84 are thereby obtained which are shown in FIG. 3 and which show respectively the spectral variations of the internal currents $I_1$ and $I_2$. These curves 83 and 84 are drawn in a frame having a horizontal axis 81 of wavelength, expressed in nm, and a vertical axis 82 of current intensity, expressed in nA. It is seen on the curves 83 and 84 that the internal current intensities $I_1$ and $I_2$ have peaks respectively centered on wavelengths $\lambda_1$ and $\lambda_2$. These wavelengths $\lambda_1$ and $\lambda_2$ have values of approximately 475 nm and 740 nm, so that the internal currents $I_1$ and $I_2$ have respectively peaks corresponding to the colors blue and red.

The discriminatory capacity with respect to wavelengths of the photodetector 1 is established from the ratio r between the two internal current intensities $I_1$ and $I_2$: $r=I_2/I_1$. The spectral evolution of the ratio r is representative of the relative influence of the spectral content of the light 5 on each of the internal currents $I_1$ and $I_2$ and can be used as a reference curve for an identification of wavelengths. The curve 86 of this spectral evolution, represented in FIG. 4, with the horizontal axis 81 and a vertical axis 85 giving the ratio r, shows a steady increase with a concave appearance (within the range of wavelengths approximately between 400 nm and 800 nm). This curve 86 is independent of the intensity of the luminous flux of the light 5, since the internal currents $I_1$ and $I_2$ have intensities proportional to the intensity of the luminous flux, and give, in a one to one manner, the wavelength of a monocluomatic light in relation to the ratio r. Variations of the ratio r of the order of 40% are obtained during a variation of temperature between 220K and 340K.

Figure 4:
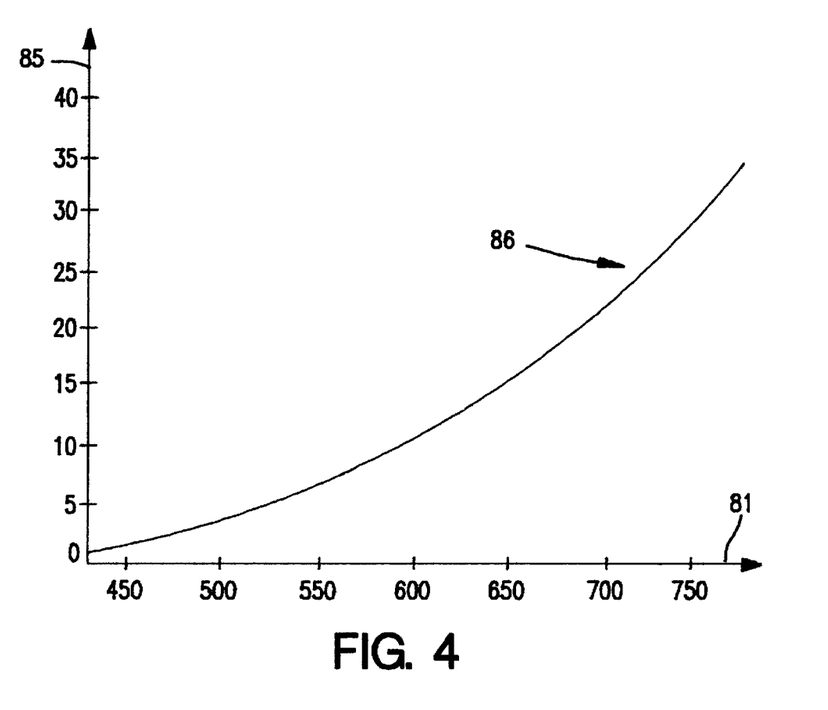
FIG. 4 show the the spectral variation of the ratio between the intensities from FIG. 3.

Hence the photodetector 1 is usable for determining the wavelength of a quasi-monochromatic light. To do this, the ratio r is determined in the manner indicated above, then the centering wavelength of the light is deduced from it by carrying the ratio r onto the curve 86. Advantageously one then also determines the intensity $\phi$ of the flux of the light 5. This luminous flux $\phi$ is obtained by means of a supplementary reference curve that gives the spectral evolution of the intensity of one of the two internal currents $I_1$ and $I_2$, for example $I_1$, for a reference luminous flux $\phi_0$. One refers to this curve in order to extract a reference intensity $I_{1,0}$ of the current $I_1$ corresponding to the determined centering wavelength. The flux $\phi$ of the light 5 is then calculated by means of the measured intensity $I_{1,m}$ of the current $I_1$ by:

$$\phi = \phi_0 \times \frac{I_{1 \cdot m}}{I_{1,0}}$$

Figure 5:
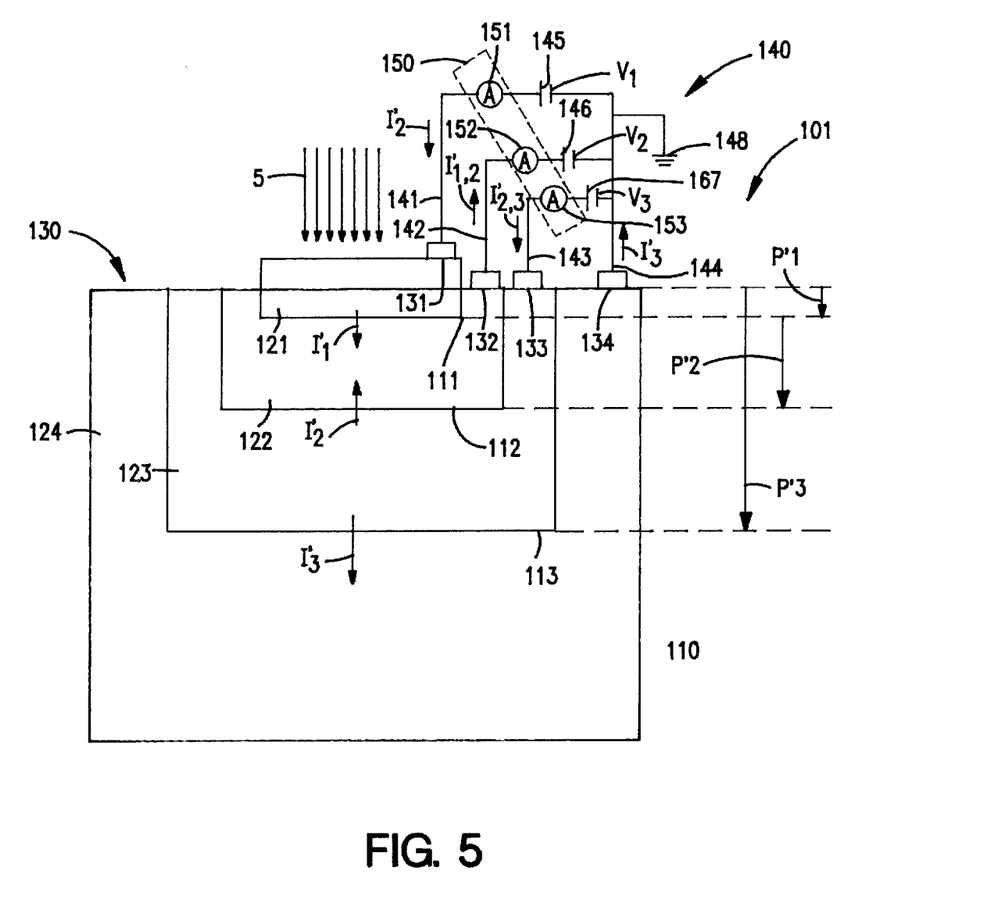
FIG. 5 is a section diagram of a second embodiment of a photodetector according to the invention.

In a second embodiment of the photodetector according to the invention, represented in FIG. 5, this photodetector, reference number 101 comprises a semiconductor structure 1which includes three successive p-n junctions marked 111–113. These junctions 111–113 are buried respectively at increasing depths P'1–P'3, are assembled in pairs in opposition and define four layers 121–124. The structure having an upper surface 130, the first layer 121 is bounded by the upper surface 130 and the first junction 111, the second layer 122 by the first and second junctions 111 and 112, the third layer 123 by the second and third junctions 112 and 113 and the fourth layer 124 by the third junction 113.

In the example shown, the layers 121 to 124 are respectively of the NPNP type, the first layer 121 being an N+ diffusion layer, the second layer 122, a P diffusion layer, the third layer 123, an n-type well and the fourth layer 124 a P substrate.

The surface 130 of the structure 110 has a photosensitive part 131 adjacent to the first layer 121, this photosensitive part being, for example, covered with a photosensitive layer 135 of polysilicon. This layer 135 of polysilicon has a thickness of a few tenths of a micron, preferably between 0.3 $\mu$m and 0.5 $\mu$m. The other layers 122 to 124 come out respectively onto parts 132–134 of the surface 130 adjacent to one another.

The photodetector 101 also comprises an external circuit 140 connected to the structure 110. This external circuit 140 comprises four branches 141–144 respectively connected to the parts 131–134 of the surface 130 corresponding to the layers 121 to 124. The fourth branch 144 is connected to the earth 148. The three other branches 141–143, connected to the fourth branch 144, are provided respectively with voltage generators 145–147 respectively applying positive voltages V1–V3 to the parts 131–133 of the surface 130. These voltages V1–V3 have the following relationships;

0<V2<V1; 0<V2<V3 so that the junctions 111–113 are reversed biased.

The external circuit 140 is connected to a device 150 for measuring the current passing through the branches 141–143. In a diagrammatic manner, the measuring device 150 is represented by three ammeters 151–153 respectively arranged in the three branches 141–143.

As in the first embodiment, the structure 1is produced by conventional integrated circuit technology, preferably BiCMOS or bipolar. Advantageously, the external circuit 140 and the measuring device 150 are also integrated onto a chip with the structure 110.

In operation, a light 5 is sent onto the photosensitive part 131 of the surface 130. This light 5 generates, at each of the junctions 111–113, an internal current respectively designated $I'_1$–$I'_3$. The internal currents $I'_1$–$I'_3$ respectively make their way from the first layer 121 to the second layer 122, from the third layer 123 to the second layer 122 and from the third layer 123 to the fourth layer 124.

The generation of the internal currents $I'_1$ and $I'_3$ in the structure 110 produces the passing of external current in the branches 141–144 of the external circuit 140. The external currents passing through the branches 141 and 144 have respectively intensities identical to those of the internal currents $I'_1$ and $I'_3$, and the external currents passing through branches 142 and 143 designated $I'_{1.2}$ and $I'_{2.3}$ have the following respective values:

$$I'_{1.2}=I'_1+I'_2; \quad I'_{2.3}=I'_2+I'_3.$$

The directions of the external currents are those following naturally from the direction of the internal currents $I'_1$–$I'_3$.

The intensities of the external currents $I'_1$, $I'_{1.2}$, $I'_{2.3}$, $I'_3$ are detected by means of the measuring device 150 and one extracts from them the intensities of the internal currents $I'_1$–$I'_3$.

The intensities of the internal currents $I'_1$–$I'_3$ each have a peak centered on a distinct wavelength. From an electronic point of view, the structure 110 is equivalent to three superimposed photodiodes, each being sensitive to a band of wavelengths. All the other parameters being fixed, the peak wavelengths can be determined by the depths P'1–P'3. Preferably, the peak wavelengths are situated within the visible range and correspond advantageously to the colors blue, green and red. The measurement of the three currents $I'_1$–$I'_3$ hence allows the calculation of the trichromatic components of the light 5 and hence the determination of its color.

Figure 6:
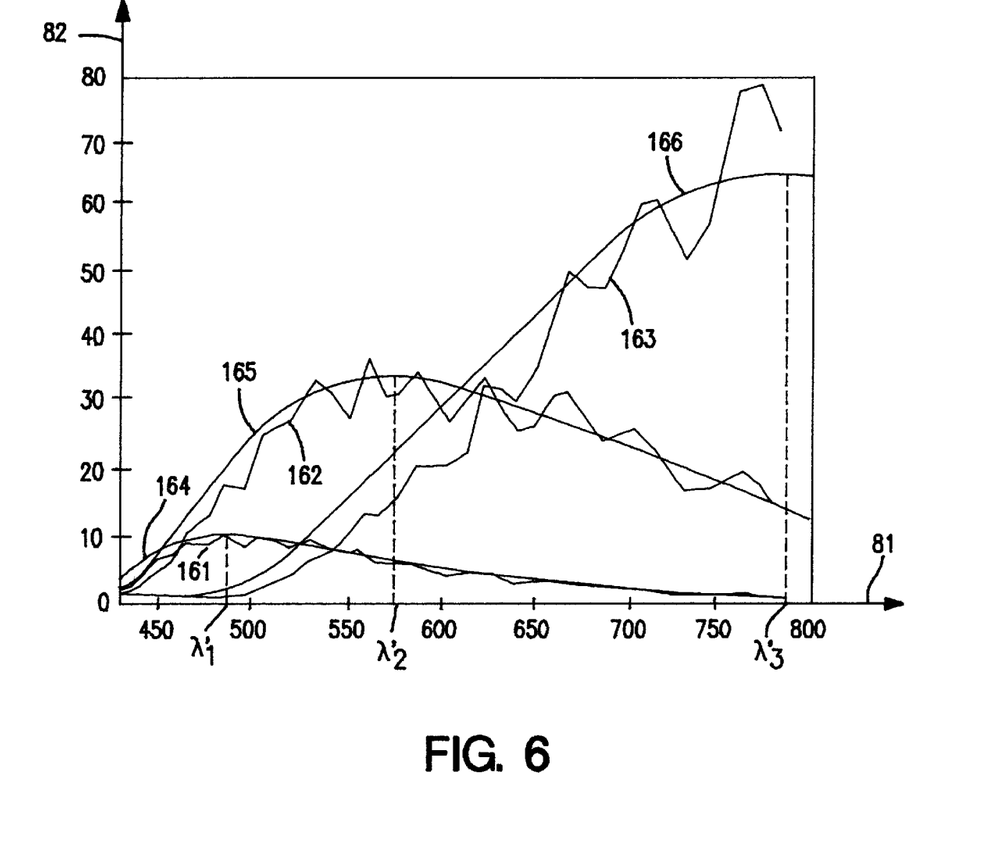
FIG. 6 shows the spectral variations of the intensities of internal currents in the photodetector of FIG. 5.

In order to determine the spectral distribution of the internal currents $I'_1$–$I'_3$, in the first embodiment, the light 5 is sent in the form of a monochromatic light, and one causes its wavelength to vary while keeping a constant optical power. By way of an example, three curves 161–163 are obtained, represented in FIG. 6, giving respectively the spectral variations of the intensities of the internal currents $I'_1$–$I'_3$. The curves 161–163 are drawn in the frame with the horizontal axis 81 being wavelengths in nm, and the vertical axis 82 being intensity in nA. The spectral evolution of the currents $I'_1$–$I'_3$ is established within a range of wavelengths between 400 and 800 nm. So as to bring to the fore the general appearance of the measured curves 161–163, these are smoothed and one obtains respectively the corresponding smoothed curves 164–166. It may be observed that each of the smoothed curves 164–166 has the shape of a bandpass filter, having a peak at a distinct wavelength, these three peak wavelengths $\lambda_1$–$\lambda_3$ having values respectively for the three internal currents $I'_1$–$I'_3$ of about 460 nm, 555 nm and 780 nm. Furthermore, the peaks have values that increase from the first curve 164 to the third curve 166.

In variants of the embodiments of the photodetectors 1 and 101, the roles of the types of layers 21–23 or 121–124 are reversed. Hence, in this variant, the structure of the semiconductor 1 is replaced by an NPN type structure and the structure 101 by a structure of the PNPN type, the external circuit 40, 140 applying reverse bias' to the junctions.

In other embodiments, the peak wavelengths are not all situated in the visible region. One may then cover, for example, the near infra red region to 1 $\mu$m or the near ultraviolet region as far as 0.3 $\mu$m.

The structure may also comprise more than three junctions whilst at the same time being produced by conventional integrated circuit technology. This allows more spectral information to be obtained about the light 5 received by the structure, the peak wavelengths corresponding to the internal currents that pass through the junctions being situated within a desired spectral range.

We claim:

1. A photodetector based on buried junctions comprising:
   a semiconductor structure (10, 110) having a surface (30, 130), and including at least two successive p-n junctions (11, 12, 111–113) buried at increasing depths (P1, P2, P'1-P'3), assembled in pairs in opposition and defining at least three layers (21–23, 121–124), one of said layers (21, 121) being adjacent to a photosensitive part (34, 131) of the surface (30, 130), each of said layers (21–23, 121–124) emerging onto a respective part (31-33, 131-134) of the surface (30, 130),
   an external circuit (40-140) connected to said parts (31–33, 131–134) of the surface (30, 130), said external circuit passing external currents ($I_1$, $I_{1.2}$, $I'_1$, $I'_{1.2}$, $I'_{2.3}$) between the layers (21–23, 121–124),
   means (44, 45, 145-147) for applying reverse bias to the junctions (11, 12, 111–113) comprising voltage generators (44, 45, 145–147) arranged in said external circuit (40, 140), and
   means (50, 150) for detecting intensities of at least two internal currents ($I_1$, $I_2$, $I'_1$–$I'_3$) passing respectively through said junctions (11, 12, 111–113), said means (50, 150) for detecting being connected to said external circuit (40, 140), said internal currents ($I_1$, $I_2$, $I'_1$–$I'_3$) being generated by the reception of light (5) on the photosensitive part (34, 131), each of the junctions (11, 12, 111-113) being associated respectively with one peak wavelength ($l_1$, $l_2$, $l'_1$–$l'_3$) of the light (5), the intensity of the internal current ($I_1$, $I_2$, $I'_1$–$I'_3$) passing through said junction (11, 12, 111-113) having a peak centered on said peak wavelength for a constant luminous power, the external currents ($I_1$, $I_{1.2}$, $I'_1$, $I'_{1.2}$, $I'_{2.3}$) comprising combinations of the internal currents ($I_1$, $I_2$, $I'_1$–$I'_3$).

2. A photodetector according to claim 1, in which the biasing means (44, 45, 145–147) and the detection means (50, 150) are incorporated in the chip.

3. A photodetector according to claim 1, in which the structure (110) includes three p-n junctions (111–113).

4. A photodetector according to claim 3, in which the structure is produced by BiCMOS technology.

5. A photodetector according to claim 3, in which the structure is produced by bipolar technology.

6. A photodetector according to claim 3, in which three peak wavelengths ($l'_1$–$l'_3$) associated with the internal currents passing through said three p-n junctions are situated respectively in wavelength ranges associated with the colors blue, green and red.

7. A photodetector according to claim 1, for which the structure (10) includes two p-n junctions (11, 12).

8. A photodetector according to claim 7, in which the structure is produced by CMOS technology.

9. A photodetector according to claim 7, for which the wavelengths ($\lambda_1$, $\lambda_2$) are respectively situated in wavelength ranges associated with the colors blue and red.

10. A photodetector according to claim 9, in which the depths (P1, P2) of the two junctions (11, 12) have values respectively between 0.3 $\mu$m and 0.5 $\mu$m and between 1.7 $\mu$m and 3.5 $\mu$m.

11. A photodetector according to claim 7, also including spectral measurement means, the light (5) having an intensity centered on a centering wavelength, the spectral measurement means calculating a value of the ratio (r) of the intensities of the two internal currents ($I_1$, $I_2$) and extracting said centering wavelength by means of a reference curve (86) giving the spectral evolution of said ratio (r).

12. An optical sensor including a plurality of photodetectors (1, 101) according to claim 1, said photodetectors (1, 101) being juxtaposed.

13. A color imaging system including at least one photodetector according to claim 1.

14. An artificial vision system including at least one photodetector according to claim 1.

15. A colors' measurement system including at least one photodetector according to claim 1.

16. A spectral measurement system including at least one photodetector according to claim 1.

17. A method of spectral measurement comprising the steps of:

sending light (5) having an intensity centered on a centering wavelength onto a photosensitive part (34) of a surface (30) of a semi-conductor structure (10), said structure (10) including two successive p-n junctions (11, 12) buried at increasing depths (P1, P2), assembled in pairs, in opposition and defining three layers (21–23), one of said layers (21) being adjacent to the photosensitive part (34) and each of the junctions (11, 12) having a reverse bias, each of said layers (21–23) emerging onto a respective part (31-33, 131-134) of the surface (30), an external circuit (40-140) connected to said parts (31-33, 131-134) of the surface (30, 130) said external circuit passing external currents ($I_1$, $I_{1.2}$, $I'_1$, $I'_{1.2}$, $I'_{2.3}$) between the layers (21–23, 121–124), said reverse bias being supplied by voltage generators (44, 45, 145–147) arranged in said external circuit (40, 140), measuring internal currents ($I_1$, $I_2$) respectively passing through said junctions (11, 12) and being generated by the sending of the light (5) using measuring means connected to said external circuit, each of the internal currents ($I_1$, $I_2$) having, for constant luminous power, an intensity peak centered on a wavelength ($l_1$, $l_2$) of the light (5), called the peak wavelength, calculating a value of the ratio (r) of the intensities of the two internal currents ($I_1$, $I_2$), and extracting said centering wavelength from a reference curve (86) giving the spectral evolution of said ratio (r).

18. A method of spectral measurement according to claim 17, further comprising the steps of:

carrying the centering wavelength obtained onto a supplementary reference curve giving the spectral evolution of the intensity of one of the two internal currents ($I_1$, $I_2$) for a reference luminous flux ($j_0$), extracting a reference intensity of said current from the supplementary reference curve, and calculating the luminous flux (j) of said light (5) by multiplying the reference luminous flux ($j_0$), by the ratio of the reference intensity of said current to the measured intensity of said current.

* * * * *